US005994028A

United States Patent [19]

Lee

[11] Patent Number: 5,994,028

[45] Date of Patent: Nov. 30, 1999

[54] THERMAL TRANSFER FILM

[75] Inventor: Seong-taek Lee, Suwon, Rep. of Korea

[73] Assignee: Samsung Display Devices Co., Ltd., Kyungki-do, Rep. of Korea

[21] Appl. No.: 09/016,427

[22] Filed: Jan. 30, 1998

[30] Foreign Application Priority Data

Jun. 23, 1997 [KR] Rep. of Korea ...................... 97 26544

[51] Int. Cl.[6] ........................................................ G03F 7/34

[52] U.S. Cl. ....................... 430/273.1; 430/200; 430/201; 430/945; 430/964

[58] Field of Search .................................... 430/200, 201, 430/273.1, 945, 964

[56] References Cited

U.S. PATENT DOCUMENTS

| | | | |
|---|---|---|---|
| 4,465,767 | 8/1984 | Oba et al. | 430/271.1 |
| 4,499,178 | 2/1985 | Wada et al. | 430/271.1 |
| 4,656,118 | 4/1987 | Ohara et al. | 430/271.1 |
| 5,441,794 | 8/1995 | Hitomi et al. | 430/200 |
| 5,534,383 | 7/1996 | Takahashi et al. | 430/201 |
| 5,693,446 | 12/1997 | Staral et al. | 430/201 |
| 5,747,217 | 5/1998 | Zaklika et al. | 430/201 |

FOREIGN PATENT DOCUMENTS

| | | |
|---|---|---|
| 4-212890 | 8/1992 | Japan . |
| 4-327983 | 11/1992 | Japan . |
| 6-24149 | 2/1994 | Japan . |
| 7-149051 | 6/1995 | Japan . |

*Primary Examiner*—Richard L. Schilling
*Attorney, Agent, or Firm*—Lowe Hauptman Gopstein Gilman & Berner

[57] ABSTRACT

A thermal transfer film is provided. The thermal transfer film having a support layer, light absorbing layer and a transfer layer further includes an insulating layer between the support layer and the light absorbing layer. The reverse transmission of heat is minimized, thereby improving the thermal energy transmission efficiency from the light absorbing layer to the transfer layer and performing a transfer process efficiently. Therefore, the quality of an image is enhanced.

11 Claims, 1 Drawing Sheet

THERMAL TRANSFER FILM

BACKGROUND OF THE INVENTION

The present invention relates to a thermal transfer film, and more particularly, to a thermal transfer film in which the image quality is improved by increasing the thermal energy transmitting efficiency to enhance sensitivity.

A laser transfer method is widely used in the fields of printing, typesetting, photography and the like. This method utilizes a principle in which an object material is transferred to a receptor by propelling the object material from a transfer film having a layer made of the object material to be transferred to the receptor.

Since a lot of energy is required in transferring the object material to the receptor, there is a need for a transfer film enabling stable and efficient transfer. A transfer film is generally varied in its structure according to the type of object material, the physical properties of a layer including the object material, and the type of energy source used for transfer.

As shown in FIG. 1, the conventional transfer film has a structure in which a light absorbing layer 12 for providing transfer energy by absorbing light, and a transfer layer 13 including an object material are stacked on a support layer 11.

However, the aforementioned thermal transfer film has a rather low efficiency in transmitting the thermal energy converted from the light energy into the transfer layer. In other words, the thermal energy converted from the light energy is reversely transmitted to a support layer, so that energy loss is unavoidable.

SUMMARY OF THE INVENTION

To solve the above problem, it is an object of the present invention to provide a thermal transfer film in which thermal energy converted in a light absorbing layer can be transmitted to a transfer layer efficiently.

Accordingly, to achieve the object, there is provided a thermal transfer film comprising a support layer, light absorbing layer formed on the support layer and converting absorbed light energy into thermal energy and a transfer layer formed on the light absorbing layer and having an object material to be transferred, which further comprises an insulating layer between the support layer and the light absorbing layer.

According to another aspect of the present invention, a thermal transfer film comprises a support layer, light absorbing layer formed on the support layer and converting absorbed light energy into thermal energy, and a transfer layer formed on the light absorbing layer and having an object material to be transferred, wherein the support layer comprises a support layer forming material and an insulating material.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENT(S)

According to the thermal transfer film of the present invention, an insulating layer made of a material having a thermal conductivity lower than that of the polymers for forming a support layer and a light absorbing layer is further provided between the support layer and the light absorbing layer. Alternatively, an insulating support layer including an insulating material is used as a support layer. As a result, the thermal energy reversely transmitted to the support layer can be minimized, thereby improving energy transmitting efficiency. Also, a transfer process is efficiently performed, thereby improving image quality.

The insulating material basically must have a low thermal conductivity and good light transmittance. An insulating material satisfying such requirements includes poly(isobutylene), poly(tetrafluoroethylene), polychlorotrifluoroethylene, poly(p-chlorostyrene), poly(vinylidene fluoride), polyvinyl chloride, polystyrene and poly(isobutene-co-isoprene). Among them, a polymer having thermal conductivity of 0.100~0.150 W/mK is preferably used.

The thermal transfer film according to the present invention will now be described with reference to accompanying drawings.

Figure 1:
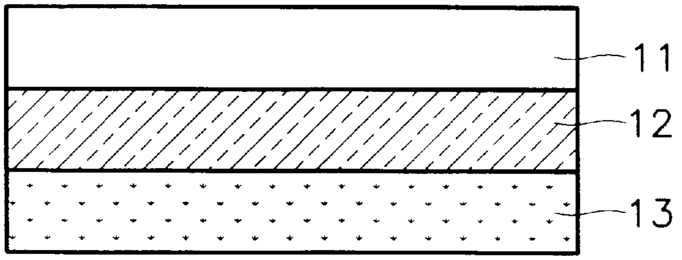
FIG. 1 (PRIOR ART)
FIG. 1 shows a conventional thermal transfer film.
Figure 2:
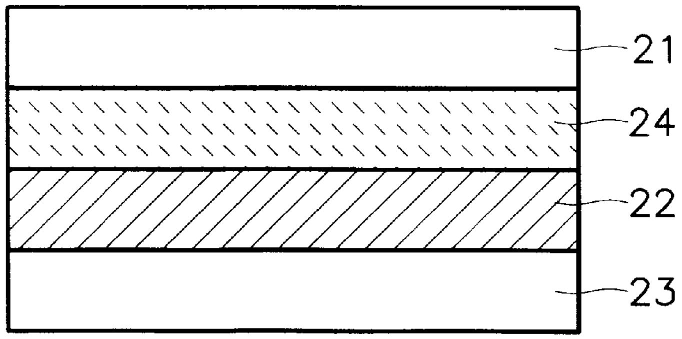
FIGS. 2 and 3 show thermal transfer films according to the present invention.

Referring to FIG. 2, a thermal insulator layer 24, a light absorbing layer 22 and a transfer layer 23 are sequentially formed on a support layer 21. If the insulating layer 24 is formed between the support layer 21 and the light absorbing layer 22, after the absorbed light energy is converted into thermal energy by the light absorbing layer 22, reverse transmission of the thermal energy from light absorbing layer to the support layer 21 can be reduced to a minimum. Therefore, it is possible to maximize the efficiency of transmission of the thermal energy from light absorbing layer to the transfer layer 23.

The thermal insulator layer 24 has almost the same thickness as that of the light absorbing layer 22, preferably 1~20 μm, and more preferably 3~4 μm. If the thickness of the thermal insulator layer 24 is less than 1 μm, the insulating effect resulting from the thermal insulator layer is not sufficient. If the thickness of the thermal insulator layer 24 is greater than 20 μm, the insulating effect is excellent. However, in this case, the overall thickness of the thermal transfer film increases, which may cause laser light disturbance during the transfer process or may weaken the structural strength of the film. Eventually, the quality of an image can be damaged.

The support layer 21 supports the other layers, and preferably has light transmittance of 90% or more. The support layer is formed of polyester, polycarbonate, polyolefin, polyvinyl resin, or most desirably polyethyleneterephthalate (PET) having excellent transparency.

Figure 3:
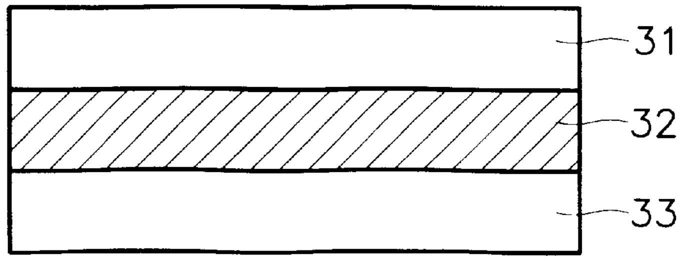

FIG. 3 shows a thermal transfer film having an insulating support layer including an insulating material.

Referring to FIG. 3, a light absorbing layer 32 and a transfer layer are sequentially formed on an insulating support layer 31 with an insulating material of a predetermined content in addition to the conventional support layer forming material.

In the thermal transfer film according to another embodiment of the present invention, a thermal insulating layer may be further provided between the insulating support layer 31 and the light absorbing layer 33.

The weight ratio of the support layer forming material to the insulating material in the insulating support layer 31 is between 3:2 and 19:1. If the weight ratio of the insulating material is lower than this range, sufficient insulation effect cannot be obtained. However, if the weight ratio of the insulating material exceeds this range, the thermal transfer film is weakened mechanically.

The thickness of the insulating support layer 31 is preferably 10~100 μm. Also, to improve the structural strength and anti-reflection property of the insulating support layer 31, an additive may be further included in addition to the support layer forming material and the insulating material. For example, by introducing a antireflection material for preventing irregular reflection of light to the insulating support layer, the performance of the thermal transfer film can be improved.

Hereinafter, the present invention will be described in detail with reference to examples, but the present invention is not limited to the following examples.

EXAMPLE 1

35 mg of polyisobutylene (weight average molecular weight: 47,000,000, thermal conductivity: 0.130 W/mK) was dissolved in 700 μl of dichloromethane, to prepare a composition for the insulating layer.

The composition for the insulating layer was coated on the polyethyleneterephthalate sheet having a thickness of 100 μm using a Mayer rod(R&I Specialties)and then dried to form a insulating layer.

A composition for a light absorbing layer prepared by dissolving 5 part by weight of carbon black (Regal 300TM, Cabol), 1 part by weight of polytetrafluoroethylene latex (Hostaflon, Hochest AG) and 1 part by weight of polyvinyl alcohol (Gelvatol 20-90, Monsanto Chemical Corp.) in water was coated on the insulating layer and then dried to form a light absorbing layer.

35 wt % of Acryl resin (GL-100, mft, Soken Kagaku K.K.), 15 wt % of propylene glycol (Aldrich Co.), 45 wt % of Sunfast Blue #249-1282 (Sun Chemical Company) and 5 wt % of benzoyl peroxide (Aldrich Co.) were dissolved in a mixed solvent including methyletheracetate (Aldrich Co.) and cyclohexane (Aldrich Co.) in a volumetric ratio of 85:15, to prepare a composition for a transfer layer. And the composition for the transfer layer was coated on the light absorbing layer using a Mayer rod and then dried to form a transfer layer having a thickness of 1.2 μm, thus completing a thermal transfer film.

EXAMPLE 2

A thermal transfer film was manufactured by the same method as Example 1, except that the composition for an insulating layer was prepared by dissolving 40 mg of poly(p-chlorostyrene) (Aldrich Co., weight average molecular weight=75,000, thermal conductivity: 0.116 W/mK) in 800 μl of cyclohexanone.

EXAMPLE 3

A thermal transfer film was manufactured by the same method as Example 1, except that the composition for an insulating layer was prepared by dissolving 40 mg of polyvinylchloride (BF Goodrich Chem. Group, Trade designation GEON 178, thermal conductivity: 0.130 W/mK) in 700 μl of dichloromethane.

EXAMPLE 4

A thermal transfer film was manufactured by the same method as Example 1, except that the composition for an insulating layer was prepared by dissolving 20 mg of polyisobutyrene (thermal conductivity: 0.130 W/mK)and 20 mg of polyvinylchloride (thermal conductivity: 0.130 W/mK) in 700 μl of dichloromethane.

A film pattern was formed using the thermal transfer film of Examples 1~4. As the result, the width of the pattern formed using the thermal transfer film of Examples 1~4 was larger than that in the prior art.

As described above, if an insulating layer is formed between a support layer and light absorbing layer or an insulating material is introduced to the support layer of a thermal transfer film, reverse transmission of heat is reduced, thereby increasing heat transmission to a transfer layer. As a result, the transfer threshold energy decreases. That is, a light source energy lower than the conventional one can be used. Therefore, image inferiority such as distorted image edges or damaged images due to transfer of a light absorbing layer, which is caused by using high energy light source, can be avoided.

The thermal transfer film according to the present invention is applicable to display devices. Particularly, the thermal transfer film according to the present invention can be useful in manufacturing a color filter for a liquid crystal display.

What is claimed is:

1. A thermal transfer film comprising a support layer, a light absorbing layer formed on the support layer for converting absorbed light energy into thermal energy, and a transfer layer formed on the light absorbing layer and having an object material to be transferred, further comprising an insulating layer between the support layer and light absorbing layer, said insulating layer formed of at least one material selected from the group consisting of poly(isobutvlene), poly(tetrafluoroethylene), polychlorotriuoroethylene, poly(vinylidene fluoride), and poly(isobutene-co-isoprene).

2. The thermal transfer film of claim 1, wherein the insulating layer is formed of a polymer having a thermal conductivity of 0.100~0.150 W/mK.

3. The thermal transfer film of claim 1, wherein the thickness of the insulating layer is 1~20 μm.

4. The thermal transfer film of claim 1, wherein the thermal transfer film is used in manufacturing a display device.

5. A thermal transfer film comprising a support layer, a light absorbing layer formed on the support layer and converting absorbed light energy into thermal energy, and a transfer layer formed on the light absorbing layer and having an object material to be transferred, wherein the support layer comprises a support layer forming material and an insulating material, said insulating material formed of at least one material selected from the group consisting of poly(isobutylene), poly(tetrafluoroethylene), polychlorotrifluoroethylene, poly(p-chlorostyrene), poly(vinylidene fluoride), and poly(isobutene-co-isoprene).

6. The thermal transfer film of claim 5, wherein a anti-reflection material is further included in the support layer.

7. The thermal transfer film of claim 5, further comprising an insulating layer between the support layer and the light absorbing layer.

8. The thermal transfer film of claim 5, wherein the thermal conductivity of the insulating material is 0.100~0.150 W/mK.

9. The thermal transfer film of claim 6, wherein the weight ratio of the support layer forming material to the insulating material is in a range between 3:2 and 19:1.

10. The thermal transfer film of claim 5, wherein the thickness of the support layer is 10~100 μm.

11. The thermal transfer film of claim 5, wherein the thermal transfer film is used in manufacturing a display device.

* * * * *